United States Patent
McClure

Patent Number: 5,471,431
Date of Patent: Nov. 28, 1995

[54] STRUCTURE TO RECOVER A PORTION OF A PARTIALLY FUNCTIONAL EMBEDDED MEMORY

[75] Inventor: David C. McClure, Carrollton, Tex.

[73] Assignee: SGS-THOMSON Microelectronics, Inc., Carrollton, Tex.

[21] Appl. No.: 51,184

[22] Filed: Apr. 22, 1993

[51] Int. Cl.⁶ .................................................. G11C 13/00
[52] U.S. Cl. ............................... 365/225.7; 365/230.03; 365/200
[58] Field of Search .............................. 365/200, 225.7, 365/230.03, 201; 371/10.1, 10.2, 10.3

[56] References Cited

U.S. PATENT DOCUMENTS

| | | | |
|---|---|---|---|
| 4,667,288 | 5/1987 | Keeley et al. | 364/200 |
| 4,975,881 | 12/1990 | Kagami | 371/10.3 |
| 5,021,944 | 6/1991 | Sasaki et al. | 365/200 |
| 5,070,502 | 12/1991 | Supnik | 371/11.1 |
| 5,146,429 | 9/1992 | Kawai et al. | 365/200 |
| 5,227,999 | 7/1993 | Ihara et al. | 371/10.1 |
| 5,251,174 | 10/1993 | Hwang | 371/10.2 |

FOREIGN PATENT DOCUMENTS 0098755 1/1984 European Pat. Off. .
WO-A-
8301147 3/1983 WIPO .

Primary Examiner—David C. Nelms
Assistant Examiner—Vu A. Le
Attorney, Agent, or Firm—Renee M. Larson; Lisa K. Jorgenson; Richard K. Robinson

[57] ABSTRACT

According to the present invention, one or more addresses are forced to a logic state to define a smaller, fully functional portion of embedded memory. A first preferred embodiment has a first fuse circuit and a second fuse circuit which control the conduction and the output signal of a transmission gate which passes through an address signal. The output signal of both the first and the second fuse circuits are input signals to logic circuitry which produces a first input signal and a second input signal to the transmission gate. When the first fuse is blown, the address signal is forced to a first logic state and when the second fuse is blown, the address signal is forced to a second logic state. When neither the first fuse nor the second fuse is blown, the address signal is simply passed through the transmission gate. A second preferred embodiment of the present invention has a first fuse circuit, a second fuse circuit, and an inverting stage through which an address signal passes. When the first fuse is blown, the address signal is forced to a first logic state and when the second fuse is blown, the address signal is forced to a second logic state. When neither the first fuse nor the second fuse is blown, the address signal is inverted.

22 Claims, 2 Drawing Sheets

STRUCTURE TO RECOVER A PORTION OF A PARTIALLY FUNCTIONAL EMBEDDED MEMORY

BACKGROUND OF THE INVENTION

1. Field of the Invention

The present invention relates generally to integrated circuit memory devices, and more specifically to a structure for utilizing a portion of an embedded memory.

2. Description of the Prior Art

During the manufacture of integrated circuit memory devices, die are often discarded because a portion of the die is defective and can not be repaired at, for instance, laser repair. Even though a major portion of the die may be fully functional, it is often necessary to discard the entire die as scrap because the functional portion of the die is not recoverable. For instance, it is not uncommon to scrap a 64K SRAM die which is partially functional and could yield a 16K SRAM. Even though the 64K SRAM could be used as a smaller 16K SRAM device, it must be scrapped if there is no plausible method to recover the functional portion.

This concern for recovering a portion of an integrated circuit die extends fully to embedded memories which find a wide variety of uses in devices such as application specific integrated circuits (ASICs) and microprocessors. In microprocessor devices, a significant amount of embedded memory is often required; for instance, the Intel i860 RISC processor and the MIP R4000 processor both have 32K bytes of on-chip and cache memory. Additionally, Texas Instrument's Super SPARC processor has 36K bytes of internal memory. In the future, it is likely that both processors and ASICs will continue to house larger and larger amounts of memory.

As the need for larger embedded memories grows, the yield constraints driven by manufacturing concerns will grow as well. Redundancy testing has typically been used to test for functionality, but this method may not be sufficient or practical for larger embedded memories. As a result, microprocessors or ASICs which may be fully functional, other than having a partially functional embedded memory, may be scrapped. Because of the high price and profit margin associated with these devices, it becomes important to recover embedded memory if possible so that scrapping is kept to a minimum.

SUMMARY OF THE INVENTION

It would be advantageous in the art to be able to define a portion of an embedded memory. For example, a smaller, functional portion of an otherwise only partially functional embedded memory device could be used as a fully functional, smaller density embedded memory.

Therefore, according to the present invention, one or more addresses are forced to a logic state to define a smaller, fully functional portion of embedded memory. A first preferred embodiment has a first fuse circuit and a second fuse circuit which control the conduction and the output signal of a transmission gate which passes through an address signal. The output signal of both the first and the second fuse circuits are input signals to logic circuitry which produces a first input signal and a second input signal to the transmission gate. When the first fuse is blown, the address signal is forced to a first logic state and when the second fuse is blown, the address signal is forced to a second logic state. When neither the first fuse nor the second fuse is blown, the address signal is simply passed through the transmission gate.

A second preferred embodiment of the present invention has a first fuse circuit, a second fuse circuit, and an inverting stage through which an address signal passes. When the first fuse is blown, the address signal is forced to a first logic state and when the second fuse is blown, the address signal is forced to a second logic state. When neither the first fuse nor the second fuse is blown, the address signal is inverted.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

During the manufacture of devices containing embedded memory, such as application specific integrated circuits (ASICs) or microprocessors, a decrease in yield is often experienced due to a portion of the embedded memory not being functional. These expensive devices may be perfectly functional except for the embedded memory. This leads to the wasteful scrapping of devices which could be used if a functional portion of the embedded memory array could be salvaged.

According to the present invention, one or more addresses are disabled by forcing them to a logic state, typically a high or a low logic state, in order to define a smaller, fully functional portion of embedded memory. By the proper selection of address signals to be forced to a logic state, a smaller portion of embedded memory of virtually any size, such as one-half, one-fourth or one-eighth the size of the embedded memory, may be chosen. In this way, embedded memories which are only partially functional may be used. The device could still be marketed as having a smaller embedded memory.

Flexibility in choosing the size of the embedded memory to be defined is enhanced when a large number of memory addresses have the capability to be forced to a logic state. However, for simplicity, just a row address and a column address could both have the capability to be forced to a logic state, such that if the embedded memory has a locked row, the row address is forced to an appropriate logic state, and if the memory has a locked column, the column address is forced to an appropriate logic state to bypass the locked element. As an example, if these conditions exist, then both the row address and the column address would be forced to a logic state, defining a fully functional memory one-fourth the size of the original embedded memory.

Figure 1:
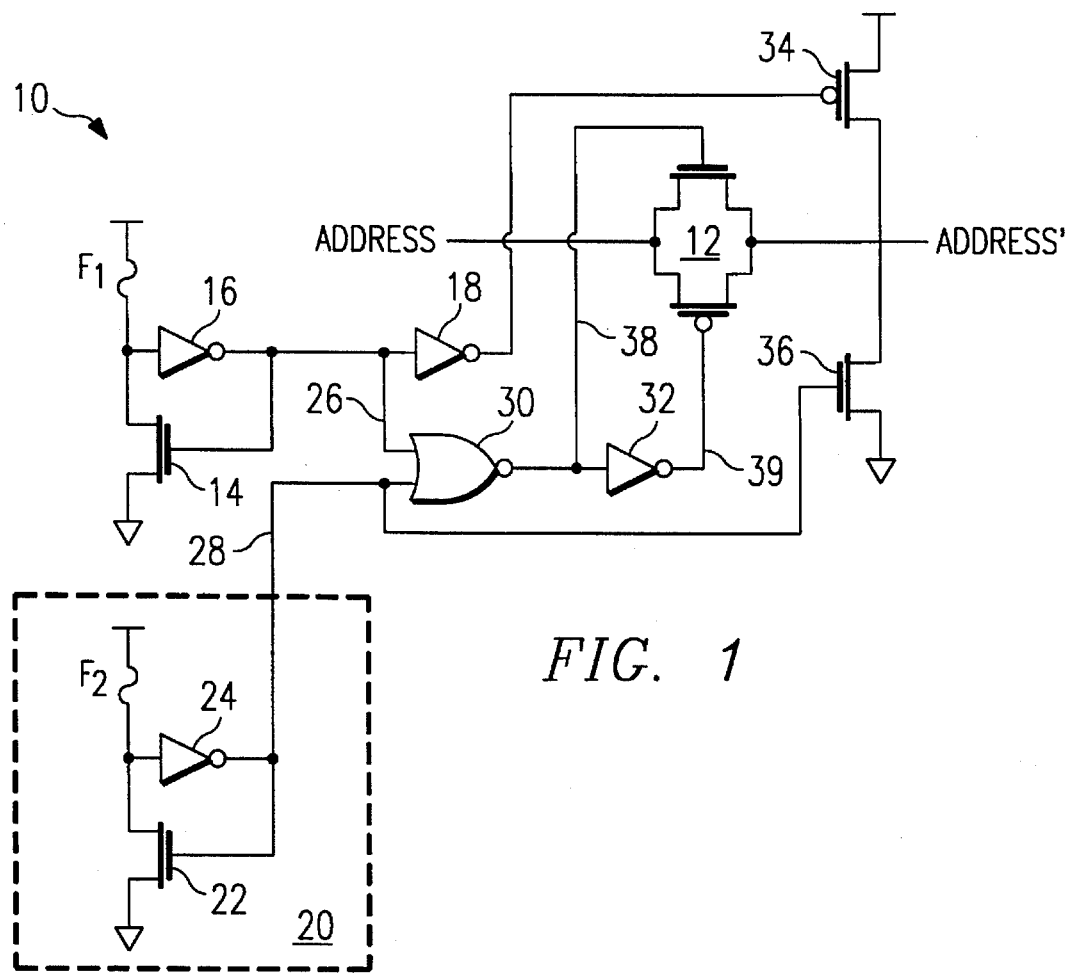
FIG. 1 is a schematic diagram of circuitry used to force an address signal to a given logic state according to a first preferred embodiment of the present invention.

The circuitry used to force an address signal to a given logic level can take many forms. FIG. 1 shows a schematic diagram of circuitry 10 used to force an address signal to a given logic state according to a first preferred embodiment of the present invention. The ADDRESS signal passes through transmission gate 12 before becoming the ADDRESS' signal, and the logic state of the ADDRESS' signal is determined by fuse F1, fuse F2, transmission gate 12, pull-up transistor 34, and pull-down transistor 36. Fuse circuitry is exemplified by circuitry 20 which has a fuse F2, n-channel transistor 22, and inverter 24.

When fuse F1 and F2 are left intact, the gate of p-channel transistor 34 is at a high logic level, and the gate of n-channel transistor 36 is at a low logic level. The input signals 26 and 28 of NOR gate 30 are a low logic level such that transmission gate 12 is conducting and the ADDRESS signal is passed through transmission gate 12 as the ADDRESS' signal. However, when fuse F1 is blown, the gate of the input of inverter 16 is locked low through n-channel transistor 14 which is connected to ground, the gate of pull-up p-channel transistor 34 is turned on and is at a low logic level, and NOR gate 30 does not allow transmission gate 12 to conduct. These conditions force the ADDRESS' signal to a high logic level. Similarly, when fuse F2 is blown, the gate of the input of inverter 24 is locked to ground through n-channel transistor 22, leaving the gate of pull-down n-channel transistor 36 turned on and at a high logic level, and, because of NOR gate 30, transmission gate 12 does not conduct and the ADDRESS' signal is forced to a low logic level.

Figure 1A:
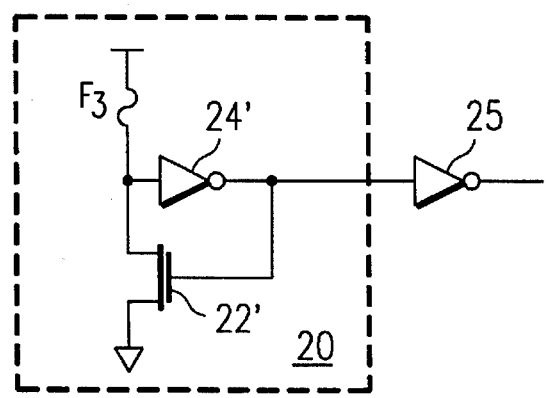
FIG. 1a is a schematic diagram of fuse circuitry used to force an address signal to a given logic state according to a first preferred embodiment of the present invention.

The circuitry 10 shown above may be slightly modified by replacing logic NOR gate 30 with circuitry analogous to fuse circuitry 20 and an additional inverter; there would be three fuses in circuitry 10. The fuse circuitry 20 and additional inverter which would replace NOR gate 30 is shown in FIG. 1a. Fuse circuitry 20 would contain a third fuse F3, an n-channel transistor 22', and an inverter 24'; fuse circuitry 20 would attach to an additional inverter 25 as shown in FIG. 1a. In this instance, it would be necessary to blow the additional fuse in conjunction with the first fuse F1 to force the ADDRESS' signal to a high logic state or to blow the additional fuse in conjunction with the second fuse F2 to force the ADDRESS' signal to a low logic state. Additionally, fuse circuitry such as that shown in circuitry 20 could be configured differently such that a p-channel transistor could be used instead of n-channel transistor 22. In this case, fuse F2 could be connected directly to ground voltage potential and n-channel transistor 22 would be replaced by a p-channel transistor which is connected directly to Vcc.

Figure 2:
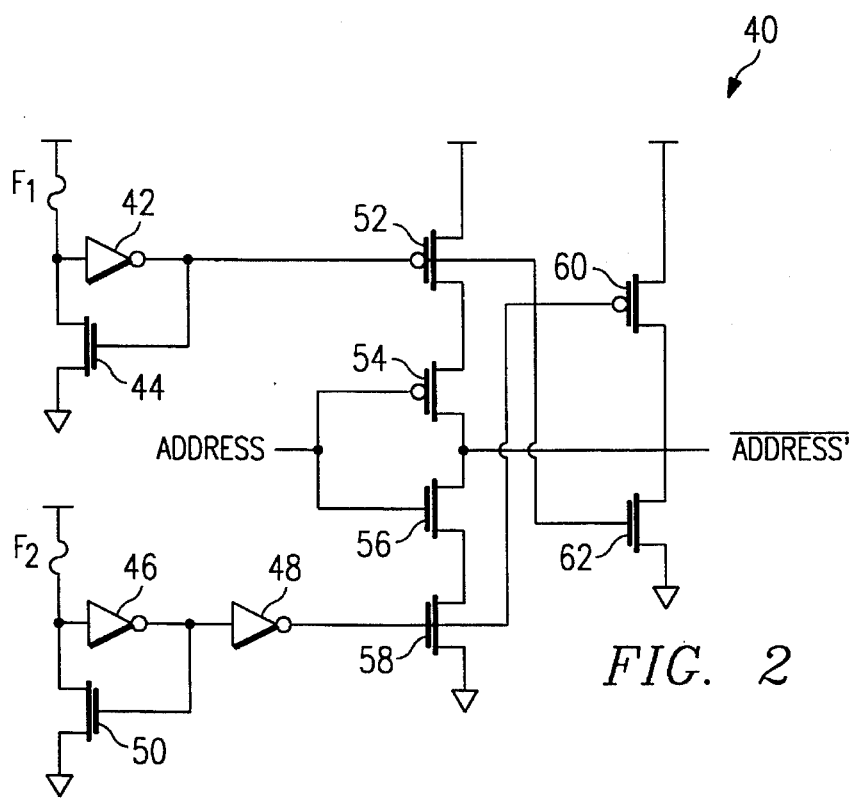
FIG. 2 is a schematic diagram of circuitry used to force an address signal to a given logic state according to a second preferred embodiment of the present invention.

A second embodiment of the invention which forces an address signal to a given logic state is now discussed. FIG. 2 shows a schematic diagram of circuitry 40 which has an inverting stage rather than the transmission gate 12 of FIG. 1. The logic state of the $\overline{\text{ADDRESS'}}$ signal is determined by fuse F1, fuse F2, pull-up transistor 60, pull-down transistor 62, and transistors 52, 54, 56, and 58 which are connected in series to ground and V$_{cc}$. The sources/drains of transistors 54 and 56 are connected such that when both fuses F1 and F2 are left intact, n-channel pull-down transistor 62 and p-channel pull-up transistor 60 are off; the gate of transistor 62 is a logic low and the gate of transistor 60 is a logic high. Transistors 52 and 58 are on, and the ADDRESS signal gets inverted and becomes the $\overline{\text{ADDRESS'}}$ signal.

When fuse F1 is blown, the gate of pull-down transistor 62 is a logic high, and $\overline{\text{ADDRESS'}}$ is forced to a logic low; transistor 52 does not conduct. Similarly, when fuse F2 is blown, the gate of pull-up transistor 60 is a logic low, and $\overline{\text{ADDRESS'}}$ is forced to a logic high; transistor 58 does not conduct. Therefore, when fuse F1 is blown, the $\overline{\text{ADDRESS'}}$ signal is forced to a low logic state; when fuse F2 is blown, the $\overline{\text{ADDRESS'}}$ signal is forced to a high logic state.

The idea of forcing one or more address signals to a defined logic state may also be used to ensure that, for instance, a microprocessor always issues a desired value for a given address bit. For this reason, it is important that the status of address bits which have been forced to a specific logic state be communicated to the microprocessor or ASIC in which the memory is embedded. This may be done by monitoring the state of the output of the first fuse circuit and the output of the second fuse circuit. By building into the microprocessor's address fetch and pipeline circuitry the ability to lock an address bit to a given logic state, the microprocessor will always issue the appropriate address bit or bits in the desired logic state in order to render a functional smaller embedded memory.

Figure 1B:
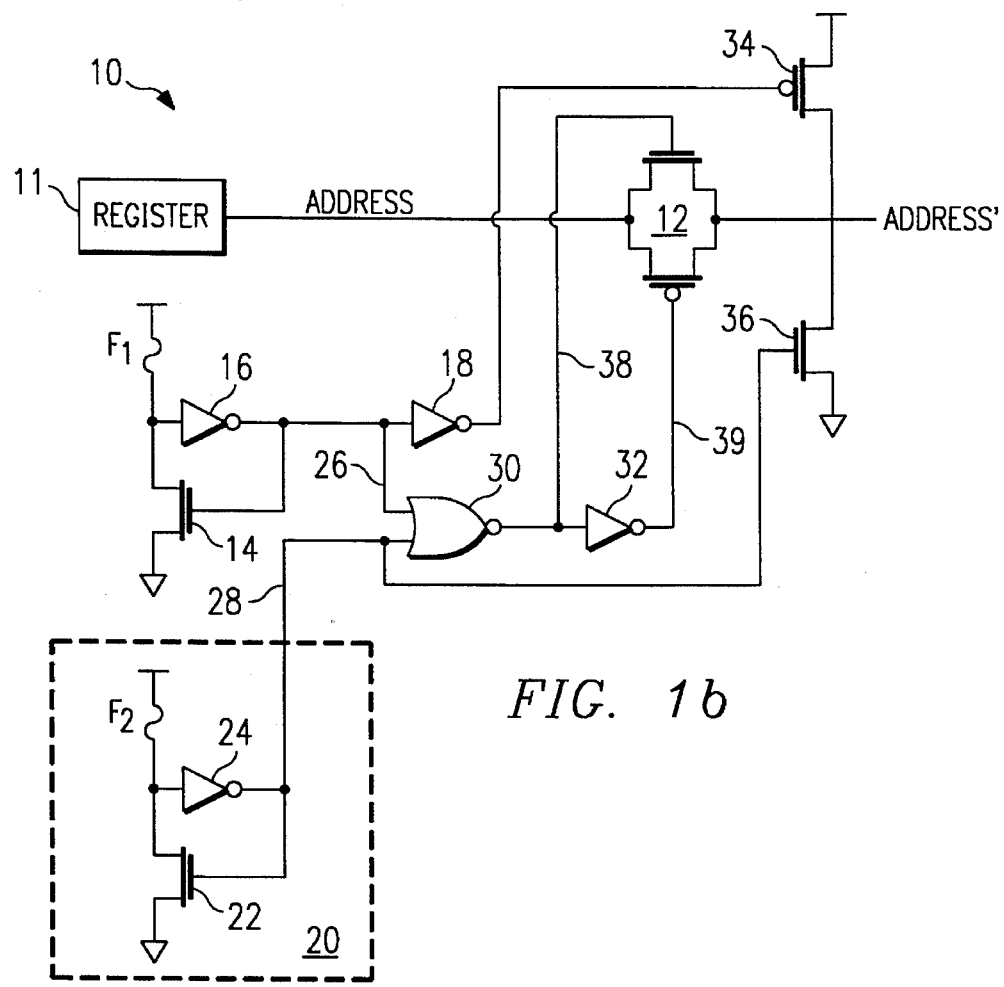
FIG. 1b is a register in which a status bit may be stored.

Normally during the testing of an embedded memory, a status bit or bits are set to indicate the status of various address bits to render a fully functional, smaller embedded memory. Monitoring these status bits allows the internal address space of the microprocessor to be regulated by the microprocessor. This control may be especially attractive, because of the simplicity it affords, when only a small number of address bits need be forced to a logic level. In this case, only these address bits are provided with the capability to be forced to a logic level. Taking this option a step further, a register could house the status bit information which, if the microprocessor or ASIC has built-in-self-test (BIST) capabilities, could be defined with BIST results. Laser repair or programming would no longer be necessary if this approach were adopted. FIG. 1b shows such a register 11 in which a status bit may be stored.

Different approaches for defining a smaller portion of an embedded memory have been described and shown. A portion of embedded memory is defined by forcing one or more address locations to a desired logic level state; different sized portions of smaller embedded memory may be chosen by prudent selection of address locations. Fuse circuitry, having either a transmission gate or an inverter stage, allows desired address locations to be set to a desired logic state as described above. Because of the yield advantages which have been discussed, more memory may be embedded in devices such as ASICs and microprocessors and, if that memory is only partially functional, it may be recoverable as a smaller density memory.

While the invention has been particularly shown and described with reference to a preferred embodiment, it will be understood by those skilled in the art that various changes in form and detail may be made therein without departing from the spirit and scope of the invention.

What is claimed is:

1. A method for selecting a desired portion of an embedded memory which is housed in a device, comprising the steps of:

identifying at least a first address bit to define the desired portion of the embedded memory; and setting a first address signal, which correspond to the identified first address bit, to either a first logic state or a second logic state so as to define the desired portion of the embedded memory, wherein setting the first address signal is controlled by a transmission gate, a first fuse circuit, a second fuse circuit, pull-up circuitry which provides pull-up to a first supply voltage, and pull-down circuitry which provides pull-down to a second supply voltage, and wherein when the first fuse circuit is blown and the second fuse circuit is not blown, the transmission gate does not conduct and the pull-up circuitry sets the first address signal to the first logic state.

2. A method for selecting a desired portion of an embedded memory which is housed in a device, comprising the steps of:

identifying at least a first address bit to define the desired portion of the embedded memory; and setting a first address signal, which correspond to the identified first address bit, to either a first logic state or a second logic state so as to define the desired portion of the embedded memory, wherein setting the first address signal is controlled by a transmission gate, a first fuse circuit, a second fuse circuit, pull-up circuitry which provides pull-up to a first supply voltage, and pull-down circuitry which provides pull-down to a second supply voltage, and wherein when the second fuse circuit is blown and the first fuse circuit is not blown, the transmission gate does not conduct and the pull-down circuitry sets the first address signal to the second logic state.

3. A method for selecting a desired portion of an embedded memory which is housed in a device, comprising the steps of:

identifying at least a first address bit to define the desired portion of the embedded memory; and setting a first address signal, which correspond to the identified first address bit, to either a first logic state or a second logic state so as to define the desired portion of the embedded memory, wherein setting the first address signal is controlled by a transmission gate, a first fuse circuit, a second fuse circuit, pull-up circuitry which provides pull-up to a first supply voltage, and pull-down circuitry which provides pull-down to a second supply voltage, and wherein when neither the first fuse circuit nor the second fuse circuit is blown, the transmission gate conducts and the first address signal is passed through the transmission gate unchanged.

4. A method for selecting a desired portion of an embedded memory which is housed in a device, comprising the steps of:

identifying at least a first address bit to define the desired portion of the embedded memory; and setting a first address signal, which correspond to the identified first address bit, to either a first logic state or a second logic state so as to define the desired portion of the embedded memory, wherein setting the first address signal is controlled by a transmission gate, a first fuse circuit, a second fuse circuit, pull-up circuitry which provides pull-up to a first supply voltage, and pull-down circuitry which provides pull-down to a second supply voltage, and wherein the first fuse circuit is comprised of a first fuse having a first terminal and a second terminal, a first inverter having a first terminal and a second terminal, and a first transistor having a first source/drain, a second source/drain, and a gate, wherein the first terminal of the first fuse is connected to a first supply voltage, the second terminal of the right fuse is connected to the first terminal of the first inverter and the first source/drain of the first transistor, the second terminal of the first inverter is connected to the gate of the first transistor, and the second source/drain of the first transistor is connected to a second supply voltage; and wherein the second fuse circuit is comprised of a second fuse having a first terminal and a second terminal, a second inverter having a second terminal and a second terminal, and a second transistor having a first source/drain, a second source/drain, and a gate, wherein the first terminal of the second fuse is connected to the first supply voltage, the second terminal of the second fuse is connected to the first terminal of the second inverter and the first source/drain of the second transistor, the second terminal of the second inverter is connected to the gate of the second transistor, and the second source/drain of the second transistor is connected to the second supply voltage.

5. The method of claim 4, wherein the output signal of the first inverter and the output signal of the second inverter define a first input signal and a second input signal, respectively, of a logic gate having an output signal which controls the gate input signals of the transmission gate.

6. A method for selecting a desired portion of an embedded memory which is housed in a device, comprising the steps of:

identifying at least a first address bit to define the desired portion of the embedded memory; and setting a first address signal, which correspond to the identified first address bit, to either a first logic state or a second logic state so as to define the desired portion of the embedded memory, wherein setting the first address signal is controlled by a transmission gate, a first fuse circuit, a second fuse circuit, pull-up circuitry which provides pull-up to a first supply voltage, and pull-down circuitry which provides pull-down to a second supply voltage and wherein the state of the first fuse circuit and the state of the second fuse circuit are communicated to the device which houses the embedded memory by monitoring the output signal of the first fuse circuit and the output signal of the second fuse circuit, respectively.

7. A method for selecting a desired portion of an embedded memory which is housed in a device, comprising the steps of:

identifying at least a first address bit to define the desired portion of the embedded memory; and setting a first address signal, which corresponds to the identified first address bit, to either a first logic state or a second logic state so as to define the desired portion of the embedded memory, wherein setting the first address signal is controlled by a transmission gate, a first fuse circuit, a second fuse circuit, a third fuse circuit, pull-up circuitry which provides pull-up to a first supply voltage, and pull-down circuitry which provides pull-down to a second supply voltage, wherein the third fuse circuit controls the conduction of the transmission gate.

wherein the first address signal is set to the first logic state by blowing the first fuse circuit, blowing the third fuse circuit, and not blowing the second fuse circuit.

8. A method for selecting a desired portion of an embedded memory which is housed in a device, comprising the steps of:

identifying at least a first address bit to define the desired portion of the embedded memory; and setting a first address signal, which corresponds to the identified first address bit, to either a first logic state or a second logic state so as to define the desired portion of the embedded memory, wherein setting the first address signal is controlled by a transmission gate, a first fuse circuit, a second fuse circuit, a third fuse circuit, pull-up circuitry which provides pull-up to a first supply voltage, and pull-down circuitry which provides pull-down to a second supply voltage, wherein the third fuse circuit controls the conduction of the transmission gate, and wherein the first address signal is set to the second logic state by blowing the second fuse circuit, blowing the third fuse circuit, and not blowing the first fuse circuit.

9. A method for selecting a desired portion of an embedded memory which is housed in a device, comprising the steps of:

identifying at least a first address bit to define the desired portion of the embedded memory; and setting a first address signal, which corresponds to the identified first address bit, to either a first logic state or a second logic state so as to define the desired portion of the embedded memory, wherein setting the first address signal is controlled by a transmission gate, a first fuse circuit, a second fuse circuit, a third fuse circuit, pull-up circuitry which provides pull-up to a first supply voltage, and pull-down circuitry which provides pull-down to a second supply voltage, wherein the third fuse circuit controls the conduction of the transmission gate, and wherein the state of the first fuse circuit and the state of the second fuse circuit are communicated to the device which houses the embedded memory by monitoring the output signal of the first fuse circuit and the output signal of the second fuse circuit, respectively.

10. A method for selecting a desired portion of an embedded memory which is housed in a device, comprising the steps of:

identifying at least a first address bit to define the desired portion of the embedded memory; and setting a first address signal, which correspond to the identified first address bit, to either a first logic state or a second logic state so as to define the desired portion of the embedded memory, wherein setting the first address signal is controlled by a first fuse circuit, a second fuse circuit, inverting circuitry which has the capability to invert the first address signal at its output signal, pull-up circuitry which provides pull-up to a first supply voltage, and pull-down circuitry which provides pull-down to a second supply voltage, and wherein the state of the first fuse circuit and the state of the second fuse circuit are communicated to the device which houses the embedded memory by monitoring the output signal of the first fuse circuit and the output signal of the second fuse circuit, respectively.

11. A method for selecting a desired portion of an embedded memory which is housed in a device, comprising the steps of:

identifying at least a first address bit to define the desired portion of the embedded memory, wherein the first address bit is identified during testing of the embedded memory; and setting the identified first address bit to either a first logic state or a second logic state so as to define the desired portion of the embedded memory, and wherein during the testing of the embedded memory, a first status bit of the first address bit is set to a predetermined logic state, and wherein the first status bit is stored in a register and is used to define the desired portion of the embedded memory.

12. A structure for defining a portion of an embedded memory which is housed in a device, comprising:

an embedded memory, having a plurality of columns and a plurality of row;

at least a first address bit having a corresponding first address signal; and means for selecting a desired portion of the embedded memory by setting the first address signal to a first logic state, wherein setting the first address signal is controlled by a transmission gate, a first fuse circuit, a second fuse circuit, pull-up circuitry which provides pull-up to a first supply voltage, and pull-down circuitry which provides pull-down to a second supply voltage, and wherein when the first fuse circuit is blown and the second fuse circuit is not blown, the transmission gate does not conduct and the pull-up circuitry sets the first address signal to the first logic state.

13. A structure for defining a portion of an embedded memory which is housed in a device, comprising:

an embedded memory, having a plurality of columns and a plurality of row;

at least a first address bit having a corresponding first address signal; and means for selecting a desired portion of the embedded memory by setting the first address signal to a first logic state, wherein setting the first address signal is controlled by a transmission gate, a first fuse circuit, a second fuse circuit, pull-up circuitry which provides pull-up to a first supply voltage, and pull-down circuitry which provides pull-down to a second supply voltage, and wherein when the second fuse circuit is blown and the first fuse circuit is not blown, the transmission gate does not conduct and the pull-down circuitry sets the first address signal to the second logic state.

14. A structure for defining a portion of an embedded memory which is housed in a device, comprising:

an embedded memory, having a plurality of columns and a plurality of row;

at least a first address bit having a corresponding first address signal; and means for selecting a desired portion of the embedded memory by setting the first address signal to a first logic state, wherein setting the first address signal is controlled by a transmission gate, a first fuse circuit, a second fuse circuit, pull-up circuitry which provides pull-up to a first supply voltage, and pull-down circuitry which provides pull-down to a second supply voltage, and wherein when neither the first fuse circuit nor the second fuse circuit is blown, the transmission gate conducts and the first address signal is passed through the transmission gate unchanged.

15. A structure for defining a portion of an embedded memory which is housed in a device, comprising:

an embedded memory, having a plurality of columns and a plurality of row;

at least a first address bit having a corresponding first address signal; and means for selecting a desired portion of the embedded memory by setting the first address signal to a first logic state, wherein setting the first address signal is controlled by a transmission gate, a first fuse circuit, a second fuse circuit, pull-up circuitry which provides pull-up to a first supply voltage, and pull-down circuitry which provides pull-down to a second supply voltage, and wherein the first fuse circuit is comprised of a first fuse having a first terminal and a second terminal, a first inverter having a first terminal and a second terminal, and a first transistor having a first source/drain, a second source/drain, and a gate, wherein the first terminal of the first fuse is connected to a first supply voltage, the second terminal of the first fuse is connected to the first terminal of the first inverter and the first source/drain of the first transistor, the second terminal of the first inverter is connected to the gate of the first transistor, and the second source/drain of the first transistor is connected to a second supply voltage; and wherein the second fuse circuit is comprised of a second fuse having a first terminal and a second terminal, a second inverter having a second terminal and a second terminal, and a second transistor having a first source/drain, a second source/drain, and a gate, wherein the first terminal of the second fuse is connected to the first supply voltage, the second terminal of the second fuse is connected to the first terminal of the second inverter and the first source/drain of the second transistor, the second terminal of the second inverter is connected to the gate of the second transistor, and the second source/drain of the second transistor is connected to the second supply voltage.

16. The structure of claim 15, wherein the output signal of the first inverter and the output signal of the second inverter define a first input signal and a second input signal, respectively, of a logic gate having an output signal which controls the gate input signals of the transmission gate.

17. A structure for defining a portion of an embedded memory which is housed in a device, comprising:

an embedded memory, having a plurality of columns and a plurality of row;

at least a first address bit having a corresponding first address signal; and means for selecting a desired portion of the embedded memory by setting the first address signal to a first logic state, wherein setting the first address signal is controlled by a transmission gate, a first fuse circuit, a second fuse circuit, pull-up circuitry which provides pull-up to a first supply voltage, and pull-down circuitry which provides pull-down to a second supply voltage, and wherein the state of the first fuse circuit and the state of the second fuse circuit are communicated to the device which houses the embedded memory by monitoring the output signal of the first fuse circuit and the output signal of the second fuse circuit, respectively.

18. A structure for defining a portion of an embedded memory which is housed in a device, comprising:

an embedded memory, having a plurality of columns and a plurality of row;

at least a first address bit having a corresponding first address signal; and means for selecting a desired portion of the embedded memory by setting the first address signal to a first logic state, wherein setting the first address signal is controlled by a transmission gate, a first fuse circuit, a second fuse circuit, a third fuse circuit, pull-up circuitry which provides pull-up to a first supply voltage, and pull-down circuitry which provides pull-down to a second supply voltage, wherein the third fuse circuit controls the conduction of the transmission gate, and wherein the first address signal is set to the first logic state by blowing the first fuse circuit, blowing the third fuse circuit, and not blowing the second fuse circuit.

19. A structure for defining a portion of an embedded memory which is housed in a device, comprising:

an embedded memory, having a plurality of columns and a plurality of row;

at least a first address bit having a corresponding first address signal; and means for selecting a desired portion of the embedded memory by setting the first address signal to a first logic state, wherein setting the first address signal is controlled by a transmission gate, a first fuse circuit, a second fuse circuit, a third fuse circuit, pull-up circuitry which provides pull-up to a first supply voltage, and pull-down circuitry which provides pull-down to a second supply voltage, wherein the third fuse circuit controls the conduction of the transmission gate, and wherein the first address signal is set to the second logic state by blowing the second fuse circuit, blowing the third fuse circuit, and not blowing the first fuse circuit.

20. A structure for defining a portion of an embedded memory which is housed in a device, comprising:

an embedded memory, having a plurality of columns and a plurality of row;

at least a first address bit having a corresponding first address signal; and means for selecting a desired portion of the embedded memory by setting the first address signal to a first logic state, wherein setting the first address signal is controlled by a transmission state, a first fuse circuit, a second fuse circuit, a third fuse circuit, pull-up circuitry which provides pull-up to a first supply voltage, and pull-down circuitry which provides pull-down to a second supply voltage, wherein the third fuse circuit controls the conduction of the transmission gate, and wherein the state of the first fuse circuit and the state of the second fuse circuit are communicated to the device which houses the embedded memory by monitoring the output signal of the first fuse circuit and the output signal of the second fuse circuit, respectively.

21. A structure for defining a portion of an embedded memory which is housed in a device, comprising:

an embedded memory, having a plurality of columns and a plurality of row;

at least a first address bit having a corresponding first address signal; and means for selecting a desired portion of the embedded memory by setting the first address signal to a first logic state, wherein setting the first address signal is controlled by a first fuse circuit, a second fuse circuit, inverting circuitry which has the capability to invert the first address signal at its output signal, pull-up circuitry which provides pull-up to a first supply voltage, and pull-down circuitry which provides pull-down to a second supply voltage, and wherein the state of the first fuse circuit and the state of the second fuse circuit are communicated to the device which houses the embedded memory by monitoring the output signal of the first fuse circuit and the output signal of the second fuse circuit, respectively.

22. A structure for defining a portion of an embedded memory which is housed in a device, comprising:

an embedded memory, having a plurality of columns and a plurality of row;

at least a first address bit, wherein the first address bit is identified during testing of the embedded memory; and means for selecting a desired portion of the embedded memory by setting the first address bit to a first logic state, and wherein during the testing of the embedded memory, a first status bit of the first address bit is set to a predetermined logic state, and wherein the first status bit is stored in a register and the first status bit is used to define the desired portion of the embedded memory.

* * * * *